(12) United States Patent
Kao et al.

(10) Patent No.: US 10,601,160 B2
(45) Date of Patent: Mar. 24, 2020

(54) CARD EDGE CONNECTOR STRUCTURE

(71) Applicant: JESS-LINK PRODUCTS CO., LTD.

(72) Inventors: Ya-Fen Kao, New Taipei (TW);
Ching-Hung Liu, New Taipei (TW);
Hsu-Yu Li, New Taipei (TW);
Yun-Chang Yang, New Taipei (TW)

(73) Assignee: JESS-LINK PRODUCTS CO., LTD., New Taipei (TW)

( * ) Notice: Subject to any disclaimer, the term of this patent is extended or adjusted under 35 U.S.C. 154(b) by 0 days.

(21) Appl. No.: 16/239,458

(22) Filed: Jan. 3, 2019

(65) Prior Publication Data
US 2019/0393634 A1 Dec. 26, 2019

(30) Foreign Application Priority Data
Jun. 25, 2018 (TW) .............................. 107208524 U

(51) Int. Cl.
| | |
|---|---|
| *H01R 13/652* | (2006.01) |
| *H01R 12/73* | (2011.01) |
| *H01R 12/70* | (2011.01) |
| *H05K 1/11* | (2006.01) |
| *G06F 1/18* | (2006.01) |
| *H01R 12/72* | (2011.01) |
| *G06F 13/40* | (2006.01) |

(52) U.S. Cl.
CPC .......... *H01R 12/737* (2013.01); *G06F 1/185* (2013.01); *G06F 13/409* (2013.01); *H01R 12/7005* (2013.01); *H01R 12/721* (2013.01); *H05K 1/117* (2013.01); *H01R 2201/06* (2013.01)

(58) Field of Classification Search
CPC .............. H01R 13/652; H01R 13/6585; H01R 13/6586
USPC ............................................ 439/108, 607.05
See application file for complete search history.

(56) References Cited

U.S. PATENT DOCUMENTS

| | | | |
|---|---|---|---|
| 8,262,411 B2* | 9/2012 | Kondo | H01R 13/6658 439/607.01 |
| 9,337,585 B1* | 5/2016 | Yang | H01R 13/6583 |
| 9,385,482 B2* | 7/2016 | Li | H01R 13/6585 |
| 9,640,915 B2* | 5/2017 | Phillips | H01R 13/6471 |
| 9,692,183 B2* | 6/2017 | Phillips | H01R 13/6471 |
| 9,972,945 B1* | 5/2018 | Huang | H01R 13/6585 |
| 10,135,197 B2* | 11/2018 | Little | H01R 12/58 |

* cited by examiner

*Primary Examiner* — Hien D Vu
(74) *Attorney, Agent, or Firm* — Chun-Ming Shih; HDLS IPR Services

(57) ABSTRACT

A card edge connector structure includes: an insulation main body, having one side disposed with an insertion surface and having another side disposed with an installation surface; the insertion surface has an insertion port; two electrical conductive terminal sets, disposed in the insulation main body with a parallel arrangement means; each electric conductive terminal set has a positioning seat, grounding terminals and electrical conductive terminals protruded from the positioning seat, each grounding terminal has an inner side, a first end exposed in the insertion port and a second end exposed on the installation surface; and a grounding plate, disposed between the two electrical conductive terminal sets; two sides of the grounding plate are extended with grounding elastic arms towards a direction of each first end, and each grounding elastic arm is elastically abutted against the inner side of each grounding terminal.

9 Claims, 7 Drawing Sheets

CARD EDGE CONNECTOR STRUCTURE

BACKGROUND OF THE INVENTION

Field of the Invention

The present invention relates to a connector structure, especially to a card edge connector structure.

Description of Related Art

The electronic devices have been commonly used, and the transmission requirement for a peripheral interface card such as an expansion card or display card is gradually increased, so that the skilled people in the art have developed interface cards with different interface specifications such as a PCI Express, a Mini PCI express, or M. 2 (as known as NGFF), wherein the NGFF interface card is more flexible in the actual use because it has different sizes, and the NGFF interface card is able to support SATA and PCIe interfaces, so that the NGFF interface card has advantages of saving electricity and rapid transmission speed and has become the main specification in the high-end market.

However, the above-mentioned interface card is required to be electrically connected to a card edge connector, but the assembly of internal components of the card edge connector is complicated, especially different connecting means for connecting terminals and a grounding plate are provided by various providers. As such, how to simplify the structure of the grounding plate, increasing the grounding efficiency of the card edge connector and providing the assembly continence are the issues to be solved by the present invention.

SUMMARY OF THE INVENTION

The present invention is to provide a card edge connector structure, in which a grounding plate is disposed between two electrical conductive terminal sets and extended with a plurality of grounding elastic arms, each of the ground elastic arms is elastically abutted against an inner side of each of the grounding terminals, thereby increasing the grounding efficiency of the card edge connector structure and providing the assembly convenience.

Accordingly, the present invention provides a card edge connector structure, which includes: an insulation main body, having one side disposed with an insertion surface and having another side disposed with an installation surface, wherein the insertion surface has an insertion port; two electrical conductive terminal sets, disposed in the insulation main body with a parallel arrangement means, wherein each of the electric conductive terminal sets has a positioning seat, a plurality of grounding terminals and a plurality of electrical conductive terminals protruded from the positioning seat, each of the grounding terminals has an inner side, a first end exposed in the insertion port and a second end exposed on the installation surface; and a grounding plate, disposed between the two electrical conductive terminal sets, wherein two sides of the grounding plate are extended with a plurality of grounding elastic arms towards a direction of each of the first ends, and each of the grounding elastic arms is elastically abutted against the inner side of each of the grounding terminals.

Based on what has been disclosed above, there is only one grounding plate required to enable the grounding terminals at the left side and the right side to be grounded, so that the card edge connector structure is provided with advantages of increasing the grounding efficiency, saving labor and cost and increasing the assembly convenience.

Based on what has been disclosed above, a middle partition plate in the insulation main body is extended with plural fasten columns and has two latch slots, the grounding plate has plural penetrated holes, each of the fasten columns of the middle partition plate is inserted in each of the penetrated holes, and a front side and a rear side of the grounding plate are upwardly bent and extended for forming two bending protruding parts, each of the bending protruding parts is latched in each of the latch slots of the middle partition plate, so that the grounding plate can be rapidly and easily fastened below the middle partition plate, thereby greatly lowering the assembly cost of the grounding plate and allowing a problem of the location of the grounding plate being displaced to be avoided.

DETAILED DESCRIPTION OF THE INVENTION

A preferred embodiment of the present invention will be described with reference to the drawings.

Figure 1:
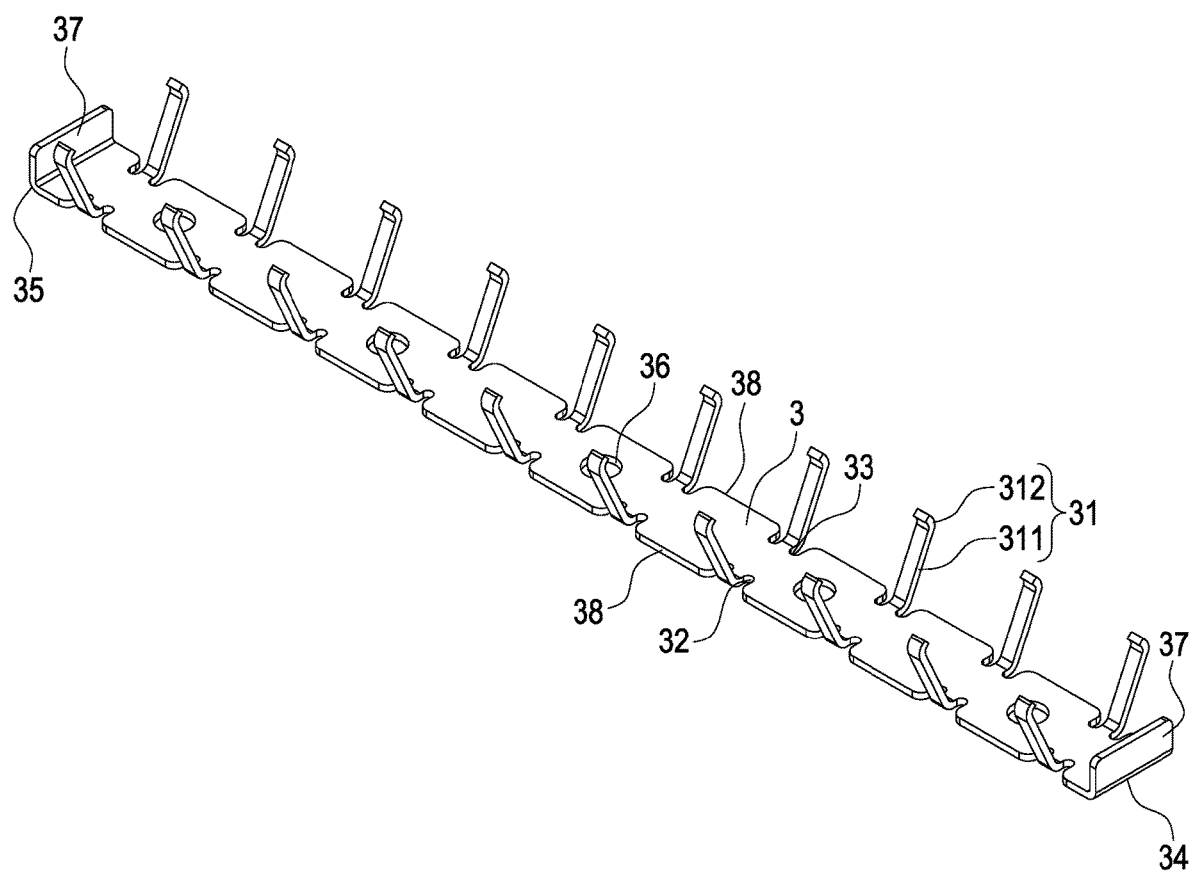
FIG. 1 is a perspective view showing a grounding plate according to the present invention.
Figure 2:
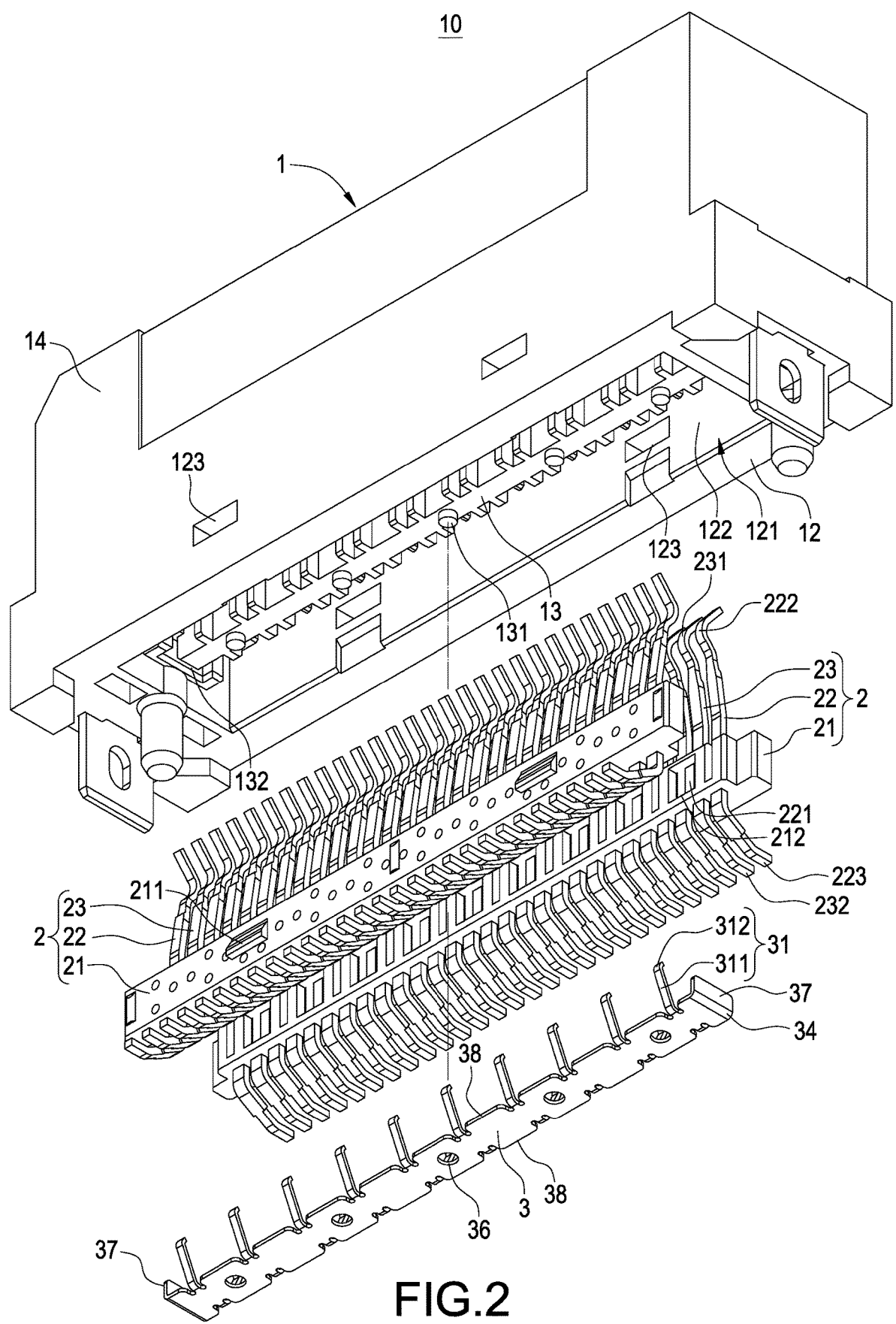
FIG. 2 is a perspective exploded view showing a card edge connector structure according to the present invention.
Figure 3:
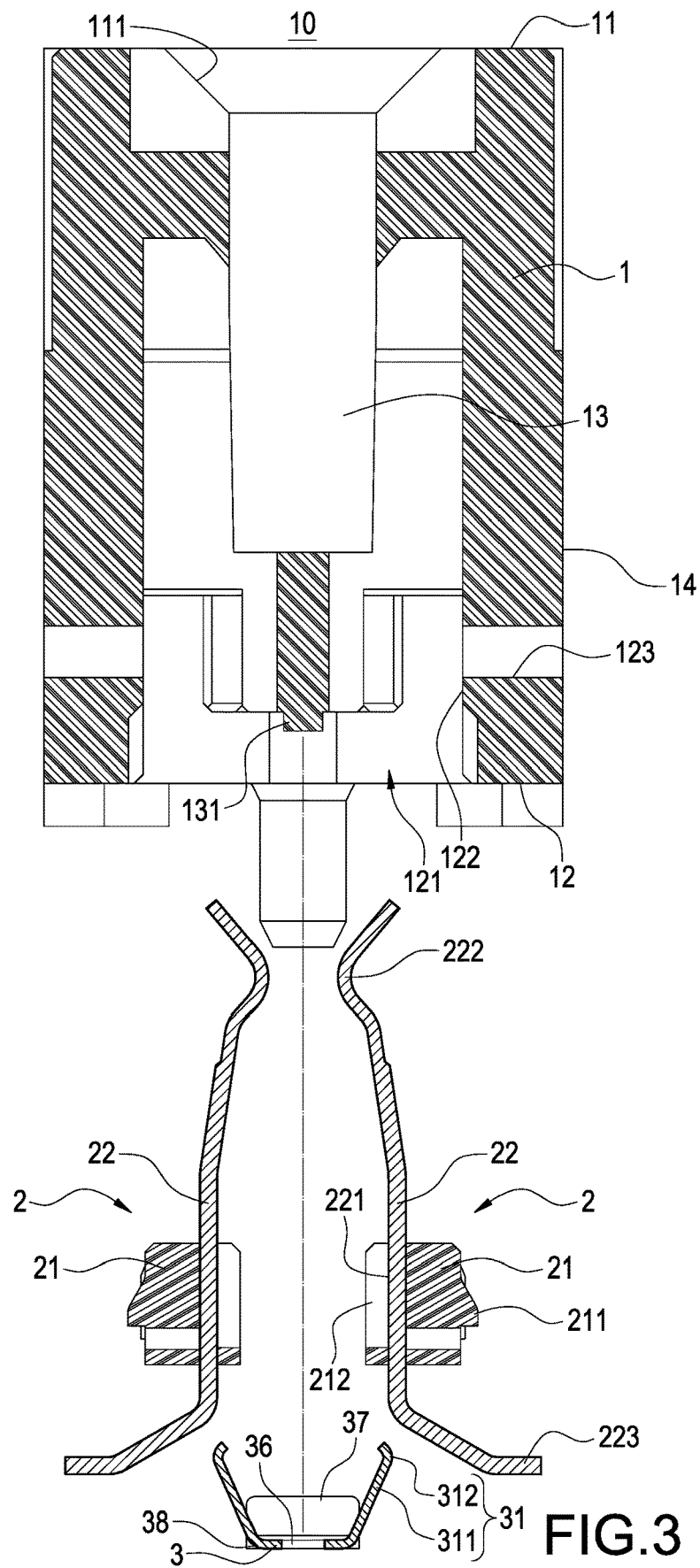
FIG. 3 is a cross sectional exploded view showing the card edge connector structure according to the present invention.
Figure 4:
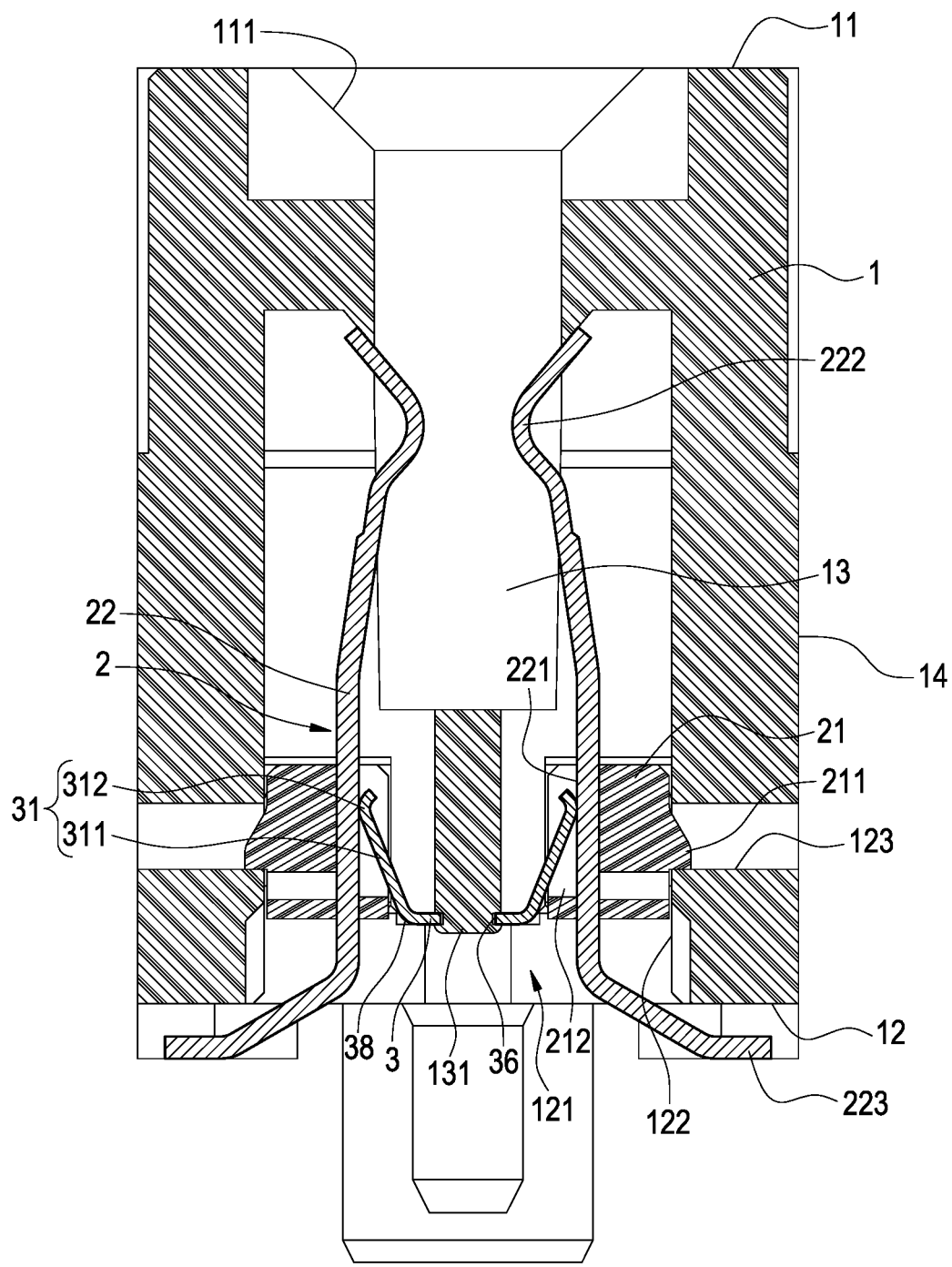
FIG. 4 is a cross sectional view showing the assembly of the card edge connector structure according to the present invention.
Figure 5:
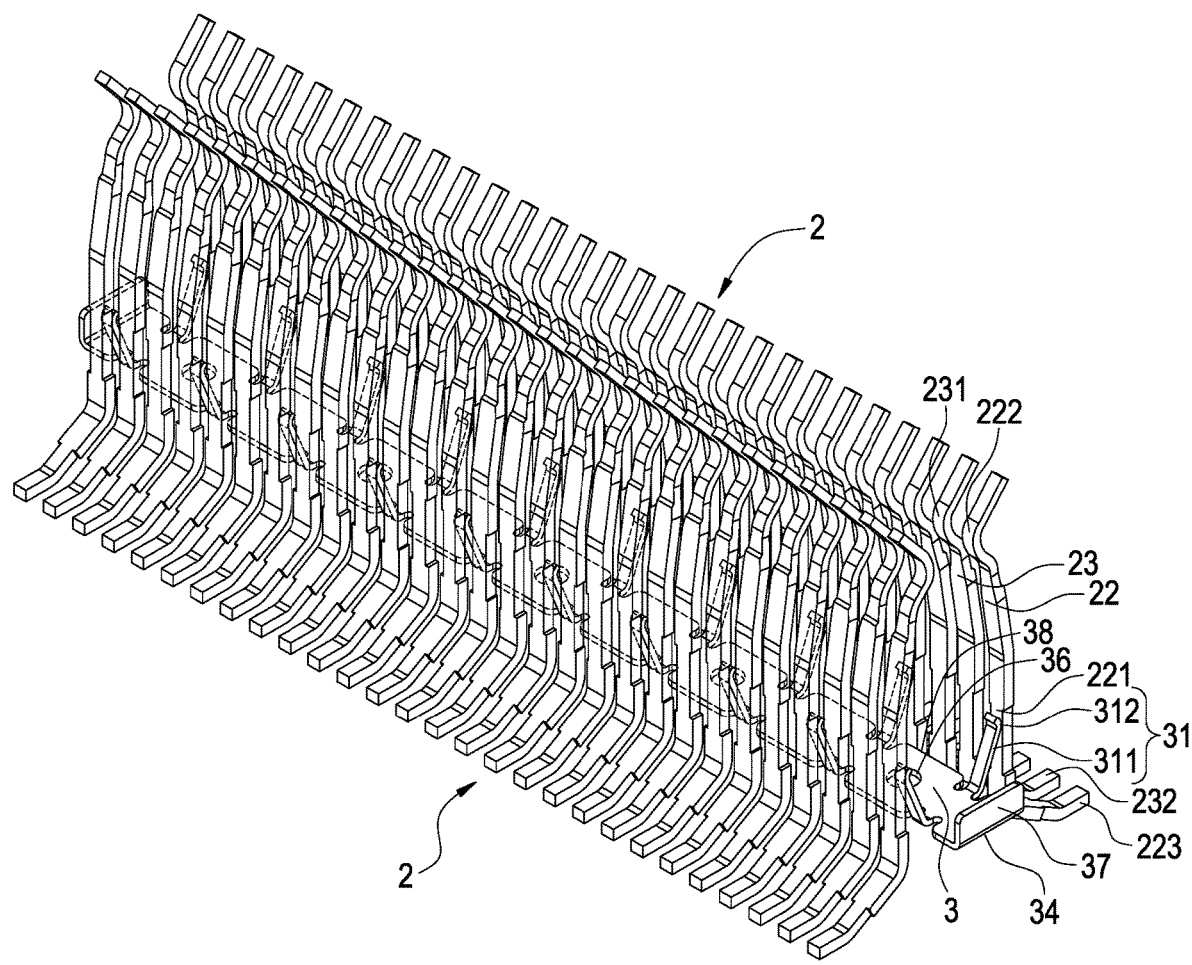
FIG. 5 is a perspective view showing the grounding plate being disposed between the two electrical conductive terminal sets according to the present invention.
Figure 6:
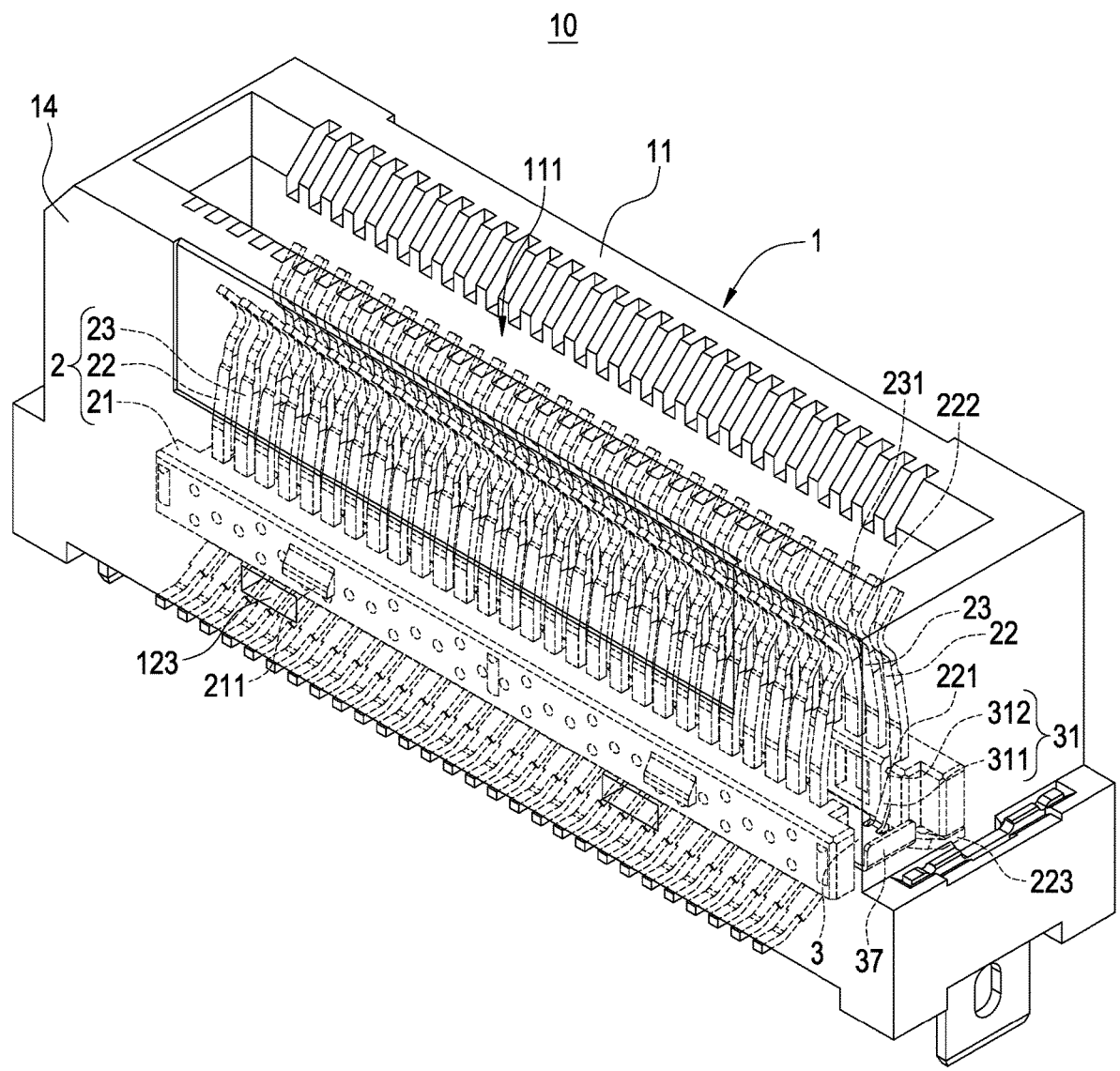
FIG. 6 is a perspective view showing the assembly of the card edge connector structure according to the present invention.
Figure 7:
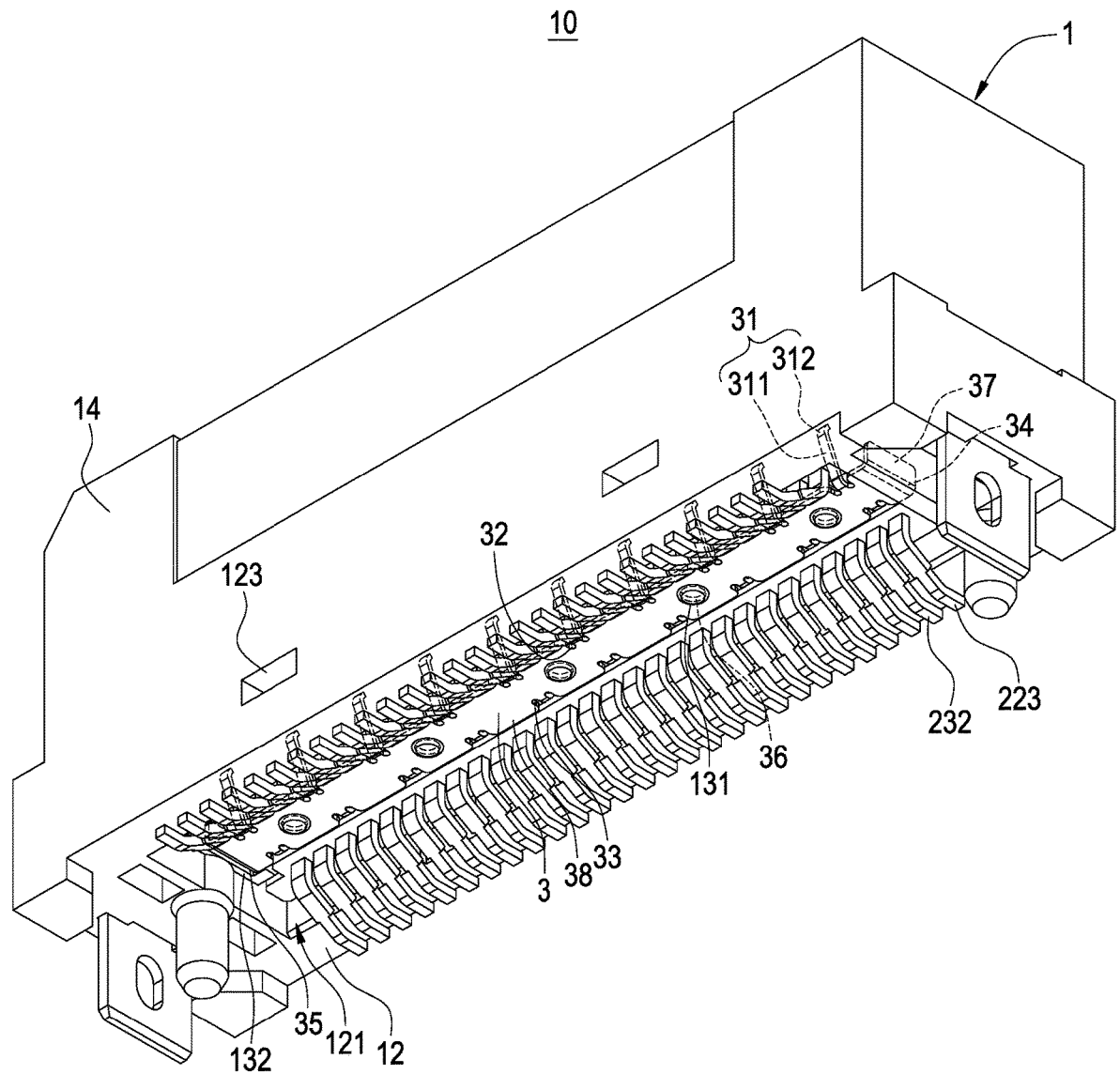
FIG. 7 is another perspective view showing the assembly of the card edge connector structure according to the present invention.

Please refer from FIG. 1 to FIG. 7, the present invention provides a card edge connector structure 10 mainly including an insulation main body 1, two electrical conductive terminal sets 2 and a grounding plate 3.

As shown from FIG. 2, FIG. 3, FIG. 4, FIG. 6 and FIG. 7, an insertion surface 11 is disposed at one side of the insulation main body 1 and an installation surface 12 is disposed at another side thereof. The insertion surface 11 has an insertion port 111, a penetrated port 121 communicated with the insertion port 111 is inwardly disposed on the installation surface 12 of the insulation main body 1, and the insulation main body 1 has an inner wall 122 inside the penetrated port 121.

Moreover, a middle partition plate 13 is disposed at an inner side of the insulation main body 1 and an outer surround wall 14 is disposed at an outer side thereof. The middle partition plate 13 is extended with a plurality of fasten columns 131 and has two latch slots 132. Wherein, the inner wall 122 has a plurality of latch grooves 123, each of the latch grooves 123 penetrates the outer surround wall 14 and the inner wall 122, but what shall be addressed is that the scope of the present invention is not limited to the above-mentioned arrangement, each of the latch grooves 123 can also be concavely disposed on the inner wall 122.

As shown from FIG. 2 to FIG. 7, the two electrical conductive terminal sets 2 are disposed in the insulation main body 1 with a parallel arrangement means, each of the electrical conductive terminal sets 2 includes a positioning seat 21, a plurality of grounding terminals 22 and a plurality of electrical conductive terminals 23 protruded from the positioning seat 21, each of the grounding terminals 22 has an inner side 221, a first end 222 exposed in the insertion port 111 and a second end 223 exposed in the penetrated port 121 of the installation surface 12.

Details are provided as follows. Each of the positioning seats 21 is extended with a plurality of protrusions 211 towards a direction away from the middle partition plate 13, each of the protrusions 211 is latched in each of the latch grooves 123, so that the two electrical conductive terminal sets 2 can be more stably positioned in the insulation main body 1, each of the positioning seats 21 has a plurality of concave slots 212, and the inner side 221 of each of the grounding terminals 22 is exposed in each of the concave slots 212.

In addition, each of the electrical conductive terminals 23 has a third end 231 exposed in the insertion port 111 and a fourth end 232 exposed in the penetrated port 121 of the installation surface 12, and the middle partition plate 13 of the insulation main body 1 is disposed between the first ends 222 and the third ends 231.

Moreover, each of the first ends 222 and each of the third ends 231 are an outwardly-bent V-shaped turnover segment, each of the second ends 223 and each of the fourth ends 232 are an outwardly-bent oblique segment and a distal end of each of the oblique segments is outwardly extended for forming a straight segment.

As shown from FIG. 1 to FIG. 7, the grounding plate 3 is disposed between the two electrical conductive terminal sets 2, two sides of the grounding plate 3 are extended with a plurality of grounding elastic arms 31 towards a direction of each of the first ends 222, each of the grounding elastic arms 31 is accommodated and limited in each of the concave slots 212 and elastically abutted against the inner side 221 of each of the grounding terminals 22.

Details are provided as follows. The grounding plate 3 has a left side 32, a right side 33, a front side 34 and a rear side 35, each of the grounding elastic arms 31 has an inclined arm 311 gradually and outwardly inclined and extended from one of the left side 32 and the right side 33 towards the direction of each of the first ends 222, the grounding plate 3 is outwardly extended with a plurality of outer blocks 38 from the left side 32 and the right side 33, and each of the outer blocks 38 is arranged between every two of the adjacent grounding elastic arms 31.

Wherein, according to this embodiment, a distal end of each of the inclined arms 311 is extended with an inwardly-bent V-shaped bending end 312, each of the V-shaped bending ends 312 is abutted against the inner side 221 of each of the grounding terminals 22, but what shall be addressed is that the scope of the present invention is not limited to the above-mentioned arrangement.

Moreover, the grounding plate 3 has a plurality of penetrated holes 36, each of the fasten columns 131 of the middle partition plate 13 is inserted in each of the penetrated hole 36, the front side 34 and the rear side 35 are upwardly bent and extended for forming a bending protruding part 37, and each of the bending protruding parts 37 is latched in each of the latch slots 132 of the middle partition plate 13.

As shown from FIG. 2 to FIG. 7, the assembly of the card edge connector structure 10 provided by the present invention is that the grounding plate 3 is disposed between the two electrical conductive terminal sets 2, two sides of the grounding plate 3 are extended with the plural grounding elastic arms 31 towards the direction of each of the first ends 222, each of the grounding elastic arms 31 is elastically abutted against the inner side 221 of each of the grounding terminals 22; accordingly, there is only one grounding plate 3 required to enable the grounding terminals 22 at the left side and the right side to be grounded, so that the card edge connector structure 10 is provided with advantages of increasing the grounding efficiency, saving labor and cost and increasing the assembly convenience.

Moreover, the middle partition plate 13 in the insulation main body 1 is extended with the plural fasten columns 131 and has the two latch slots 132, the grounding plate 3 has the plural penetrated holes 36, each of the fasten columns 131 of the middle partition plate 13 is inserted in each of the penetrated holes 36, and the front side 34 and the rear side 35 of the grounding plate 3 are upwardly bent and extended for forming the two bending protruding parts 37, each of the bending protruding parts 37 is latched in each of the latch slots 132 of the middle partition plate 13, so that the grounding plate 3 can be rapidly and easily fastened below the middle partition plate 13, thereby greatly lowering the assembly cost of the grounding plate 3 and allowing a problem of the location of the grounding plate 3 being displaced to be avoided.

Based on what has been disclosed above, the card edge connector structure provided by the present invention is novel and more practical in use comparing to prior arts.

Although the present invention has been described with reference to the foregoing preferred embodiment, it will be understood that the invention is not limited to the details thereof. Various equivalent variations and modifications can still occur to those skilled in this art in view of the teachings of the present invention. Thus, all such variations and equivalent modifications are also embraced within the scope of the invention as defined in the appended claims.

What is claimed is:

1. A card edge electrical connector structure, including:
   an insulation main body, having one side disposed with an insertion surface and having another side disposed with an installation surface, wherein the insertion surface has an insertion port;
   two electrical conductive terminal sets, disposed in the insulation main body with a parallel arrangement means, wherein each of the electric conductive terminal sets has a positioning seat, a plurality of grounding terminals and a plurality of electrical conductive terminals protruded from the positioning seat, each of the grounding terminals has an inner side, a first end exposed in the insertion port and a second end exposed on the installation surface; and
   a grounding plate, disposed between the two electrical conductive terminal sets, wherein two sides of the grounding plate are extended with a plurality of grounding elastic arms towards a direction of each of the first ends, and each of the grounding elastic arms is elastically abutted against the inner side of each of the grounding terminals,
   wherein the grounding plate is substantially perpendicular to the grounding terminals, and the plurality of grounding elastic arms are disposed between the grounding plate and the first ends; and wherein the grounding plate has a left side and a right side opposite to the left side, and each of the grounding elastic arms is an inclined arm gradually and outwardly inclined and extended from one of the left side and the right side towards the direction of each of the first ends.

2. The card edge electrical connector structure according to claim 1, wherein a distal end of each of the inclined arms is extended with an inwardly-bent V-shaped bending end, and each of the V-shaped bending ends is abutted against the inner side of each of the grounding terminals.

3. The card edge electrical connector structure according to claim 2, wherein each of the electrical conductive terminals has a third end exposed in the insertion port and a fourth end exposed on the installation surface, a middle partition plate arranged between the first ends and the third ends is disposed in the insulation main body, the middle partition plate is extended with a plurality of fasten columns, the grounding plate has a plurality of penetrated holes, and each of the fasten columns is inserted in the corresponding penetrated hole.

4. A card edge electrical connector structure, including:
an insulation main body, having one side disposed with an insertion surface and having another side disposed with an installation surface, wherein the insertion surface has an insertion port;
two electrical conductive terminal sets, disposed in the insulation main body with a parallel arrangement means, wherein each of the electric conductive terminal sets has a positioning seat, a plurality of grounding terminals and a plurality of electrical conductive terminals protruded from the positioning seat, each of the grounding terminals has an inner side, a first end exposed in the insertion port and a second end exposed on the installation surface; and
a grounding plate, disposed between the two electrical conductive terminal sets, wherein two sides of the grounding plate are extended with a plurality of grounding elastic arms towards a direction of each of the first ends, and each of the grounding elastic arms is elastically abutted against the inner side of each of the grounding terminals, wherein the grounding plate has a left side and a right side opposite to the left side, and each of the grounding elastic arms is an inclined arm gradually and outwardly inclined and extended from one of the left side and the right side towards the direction of each of the first ends, wherein a distal end of each of the inclined arms is extended with an inwardly-bent V-shaped bending end, and each of the V-shaped bending ends is abutted against the inner side of each of the grounding terminals, wherein each of the electrical conductive terminals has a third end exposed in the insertion port and a fourth end exposed on the installation surface, a middle partition plate arranged between the first ends and the third ends is disposed in the insulation main body, the middle partition plate is extended with a plurality of fasten columns, the grounding plate has a plurality of penetrated holes, and each of the fasten columns is inserted in the corresponding penetrated hole, wherein the grounding plate has a front side and a rear side opposite to the front side, the front side and the rear side are upwardly bent and extended for forming a bending protruding part, the middle partition plate has two latch slots, and each of the bending protruding part is latched in each of the latch slots.

5. The card edge electrical connector structure according to claim 4, wherein the positioning seats is extended with a plurality of protrusions towards a direction away from the middle partition plate, a penetrated port communicated with the insertion port is inwardly disposed on the installation surface of the insulation main body, the insulation main body has an inner wall inside the penetrated port, the inner wall has a plurality of latch grooves, and the plurality of protrusions is buckled the plurality of latch grooves, and each of the second ends and each of the fourth ends are exposed in the penetrated port.

6. The card edge electrical connector structure according to claim 5, wherein the insulation main body has an outer surround wall, and each of the latch grooves penetrate the outer surround wall and the inner wall.

7. The card edge electrical connector structure according to claim 6, wherein each of the positioning seats has a plurality of concave slots, the inner side of each of the grounding terminals is exposed in each of the concave slots, and each of the grounding elastic arms is accommodated and limited in each of the concave slots.

8. The card edge electrical connector structure according to claim 7, wherein the grounding plate is outwardly extended with a plurality of outer blocks from the left side and the right side, and each of the outer blocks is arranged between every two of the adjacent grounding elastic arms.

9. The card edge electrical connector structure according to claim 8, wherein each of the first ends and each of the third ends are an outwardly-bent V-shaped turnover segment, each of the second ends and each of the fourth ends are an outwardly-bent oblique segment and a distal end of each of the oblique segments is outwardly extended for forming a straight segment.

* * * * *